(12) United States Patent
Kamoshida et al.

(10) Patent No.: US 7,561,435 B2
(45) Date of Patent: Jul. 14, 2009

(54) ENGINE CONTROLLER

(75) Inventors: Masaru Kamoshida, Hitachi (JP);
Masahiro Sasaki, Hitachinaka (JP);
Takeshi Igarashi, Hitachinaka (JP);
Masahiko Asano, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/768,401

(22) Filed: Jun. 26, 2007

(65) Prior Publication Data
US 2008/0002377 A1 Jan. 3, 2008

(30) Foreign Application Priority Data
Jun. 29, 2006 (JP) ............... 2006-179929

(51) Int. Cl.
*H05K 5/06* (2006.01)
*H05K 5/02* (2006.01)

(52) U.S. Cl. .................. 361/752; 361/728; 361/730; 174/50.5; 174/520; 439/76.2

(58) Field of Classification Search ......... 361/752, 361/730, 728, 796, 736; 174/520, 52.1, 50, 174/50.5, 50.51, 50.52, 50.53, 50.54, 539, 174/554, 564; 439/76.2
See application file for complete search history.

(56) References Cited

U.S. PATENT DOCUMENTS

| | | | | |
|---|---|---|---|---|
| 5,253,143 A | * | 10/1993 | Klinger et al. | 361/736 |
| 5,253,146 A | * | 10/1993 | Halttunen et al. | 361/784 |
| 5,392,197 A | * | 2/1995 | Cuntz et al. | 361/818 |
| 5,418,685 A | * | 5/1995 | Hussmann et al. | 361/719 |
| 6,084,776 A | * | 7/2000 | Cuntz et al. | 361/707 |
| 6,222,122 B1 | * | 4/2001 | Davidson | 174/554 |
| 6,407,925 B1 | * | 6/2002 | Kobayashi et al. | 361/752 |
| 6,455,768 B2 | * | 9/2002 | Negishi | 174/17 CT |
| 6,573,448 B2 | * | 6/2003 | Mayer et al. | 174/481 |
| 6,707,678 B2 | * | 3/2004 | Kobayashi et al. | 361/752 |
| 6,717,051 B2 | * | 4/2004 | Kobayashi et al. | 174/535 |
| 6,757,155 B2 | * | 6/2004 | Koike et al. | 361/600 |
| 6,816,381 B2 | * | 11/2004 | Takeuchi | 361/752 |

(Continued)

FOREIGN PATENT DOCUMENTS

JP    10 322045    12/1998

(Continued)

*Primary Examiner*—Dameon E Levi
(74) *Attorney, Agent, or Firm*—Mattingly, Stanger, Malur & Brundidge, P.C.

(57) ABSTRACT

There is proposed an engine controller which is excellent in reliability in that the outer peripheral edge face (cut surface) of covering member can be prevented from being rusted while securing the water-proofness and dust-proofness. This engine controller comprises a circuit board (12) for controlling an engine; an aluminum die-cast main case body (20) having an open top; and a covering member (30) made of an iron-based metal plate which is preliminarily applied with surface treatment, the covering member (30) being fixedly clamped to the main case body (20) by means of a setscrew (40) so as to hermetically close the open top of the main case body (20); wherein the main case body (20) is provided thereon with a pedestal (24) or groove (25) on which a liquid or jellied water-proofing adhesive (50) is coated or filled (piled), thereby enabling entire outer peripheral edge face (33a) of the covering member (30) to be covered by the water-proofing adhesive (50).

6 Claims, 5 Drawing Sheets

U.S. PATENT DOCUMENTS

| | | | |
|---|---|---|---|
| 6,927,337 B2* | 8/2005 | Kobayashi et al. | 174/535 |
| 7,120,030 B2* | 10/2006 | Azumi et al. | 361/752 |
| 7,144,275 B2* | 12/2006 | Iida | 439/587 |
| 7,247,791 B2* | 7/2007 | Kulpa | 174/50 |
| 2006/0046535 A1* | 3/2006 | Iida | 439/76.1 |
| 2007/0072452 A1* | 3/2007 | Inagaki et al. | 439/76.2 |
| 2007/0134951 A1* | 6/2007 | Inagaki et al. | 439/74 |

FOREIGN PATENT DOCUMENTS

| | | |
|---|---|---|
| JP | 2001-085858 | 3/2001 |
| JP | 2004-153034 | 5/2004 |

* cited by examiner (A)

(B)

ENGINE CONTROLLER

BACKGROUND OF THE INVENTION

The present invention relates to an engine controller, and, in particular, to an engine controller comprising a main case body having an open top, and a covering member which is designed to be fixedly clamped to the main case body by means of a setscrew so as to hermetically close the open top, wherein a water-proofing adhesive is interposed between the main case body and the covering member.

A container for housing, for example, a circuit board for controlling an engine has been conventionally constructed so as to provide a water-proof structure in general in view of securing the water-proofness, dust-proofness and anti-corrosion thereof. This water-proof structure has been mainly accomplished by either the employment of a molded elastic member (a sealing member) which is sandwiched, in a tensioned manner, between a main case and a covering member or the employment of a liquid or jellied water-proofing adhesive, thereby achieving the water-proofness of the container (see, for example, JP Patent Laid-open Publication (Kokai) No. 2001-85858.

BRIEF SUMMARY OF THE INVENTION

However, when a container of this kind is used in a severe environment, especially in an environment where the anti-corrosion of container is strictly demanded, there is a problem that a covering member which is manufactured through the punching press molding of a plated steel plate (for example, an iron-based metal plate which is preliminarily applied with surface treatment such as plating) which is a cheap raw material and low in manufacturing cost tends to be rusted especially at an outer peripheral edge face (cut surface) to which plating is not applied, thus deteriorating commercial value of the container.

In order to cope with this problem, there has been conventionally suggested to apply plating to the outer peripheral edge face of covering member in a subsequent process or to employ aluminum in place of iron-based material as a raw material for the covering member. These measures however lead to an increase of manufacturing cost of the container, thus making expensive the engine controller housed in such a container.

The present invention has been made with a view to overcome the problems of prior art described above, and therefore an object of the present invention is to provide an engine controller which is excellent in reliability in the respect that, especially, the outer peripheral edge face (cut surface) of covering member can be prevented from being rusted while securing the water-proofness and dust-proofness of the container without inviting increase in manufacturing cost.

With a view to realize the aforementioned object, there is provided, according to one aspect of the present invention, an engine controller which basically comprises: a circuit board for controlling an engine; an aluminum die-cast main case body having an open top for housing the circuit board; and a covering member made of an iron-based metal plate which is preliminarily applied with surface treatment, such as a plated steel plate, the covering member being fixedly clamped to the main case body by means of a setscrew so as to hermetically close the open top of the main case body.

The main case body is provided, at the open top thereof, with a pedestal or groove on which a liquid or jellied water-proofing adhesive is coated or filled (piled), thereby enabling entire outer peripheral edge face of the covering member to be substantially covered by the water-proofing adhesive coated or filled on the pedestal or groove, thus hermetically sealing the interior of the main case body.

According to another aspect of the present invention, there is also provided an engine controller which basically constructed as described above, which is however featured in that a liquid or jellied water-proofing adhesive is provided between the main case body and the covering member circumferentially internally of a fixedly clamped portion where the covering member is clamped to the main case body by means of the setscrew, so as to hermetically seal the interior of the main case body, and wherein a liquid or jellied water-proofing adhesive is provided also between the main case body and the covering member circumferentially externally of the fixedly clamped portion where the covering member is clamped to the main case body by means of the setscrew, so as to hermetically seal the fixedly clamped portion.

Preferably, the covering member is manufactured through the punching press molding of a raw material constituted by an iron-based metal plate whose surface is preliminarily applied with plating.

In another preferable embodiment, the covering member is formed into an inverted dish-like or a hat-like configuration having a collar portion and an entire outer peripheral edge face of the collar portion is substantially covered by the water-proofing adhesive which is coated or filled on the pedestal or groove.

In this case, preferably, the outer peripheral edge face of the collar portion of covering member is bent downward.

In a further preferable embodiment, the main case body and the covering member are respectively formed into a rectangular configuration in plan view and four corners of the main case body are allocated as the fixedly clamped portion.

In a further preferable embodiment, the fixedly clamped portion is provided with a female screw portion into which the setscrew is screwed, and the fixedly clamped portion is provided, at a top surface thereof, with a convex portion in order to prevent the water-proofing adhesive from overflowing into the female screw portion. In this case, the convex portion is preferably provided with at least one notched groove for venting air.

According to the engine controller of the present invention, since the entire outer peripheral edge face (cut surface) of the covering member is buried in the water-proofing adhesive piled on the pedestal, for example, formed on the main case body and is hence substantially covered by the water-proofing adhesive, the outer peripheral edge face is prevented from being contacted with air. As a result, it is possible to reliably prevent the generation of rust on the outer peripheral edge face of the covering member. Therefore, even if an inexpensive iron-based metal plate, such as a plated steel plate is employed for forming the covering member, it is possible to secure excellent rust-proofness in addition to excellent water-proofness and rust-proofness even under a severe environment, thereby making it possible to effectively reduce the manufacturing cost and to enhance the reliability of engine controller.

Further, since a water-proofing adhesive is provided between the main case body and the covering member circumferentially internally of a fixedly clamped portion where the covering member is clamped to the main case body, so as to hermetically seal the interior of the main case body, and wherein a liquid or jellied water-proofing adhesive is provided also between the main case body and the covering member circumferentially externally of the fixedly clamped portion where the covering member is clamped to the main case body, so as to hermetically seal the fixedly clamped portion, it is possible to reliably prevent the generation of rust and loosening at a portion where the setscrew is located, thus further enhancing the reliability of engine controller.

DETAILED DESCRIPTION OF THE INVENTION

Next, various embodiments of the engine controller according to the present invention will be explained with reference to the drawings.

Figure 1:
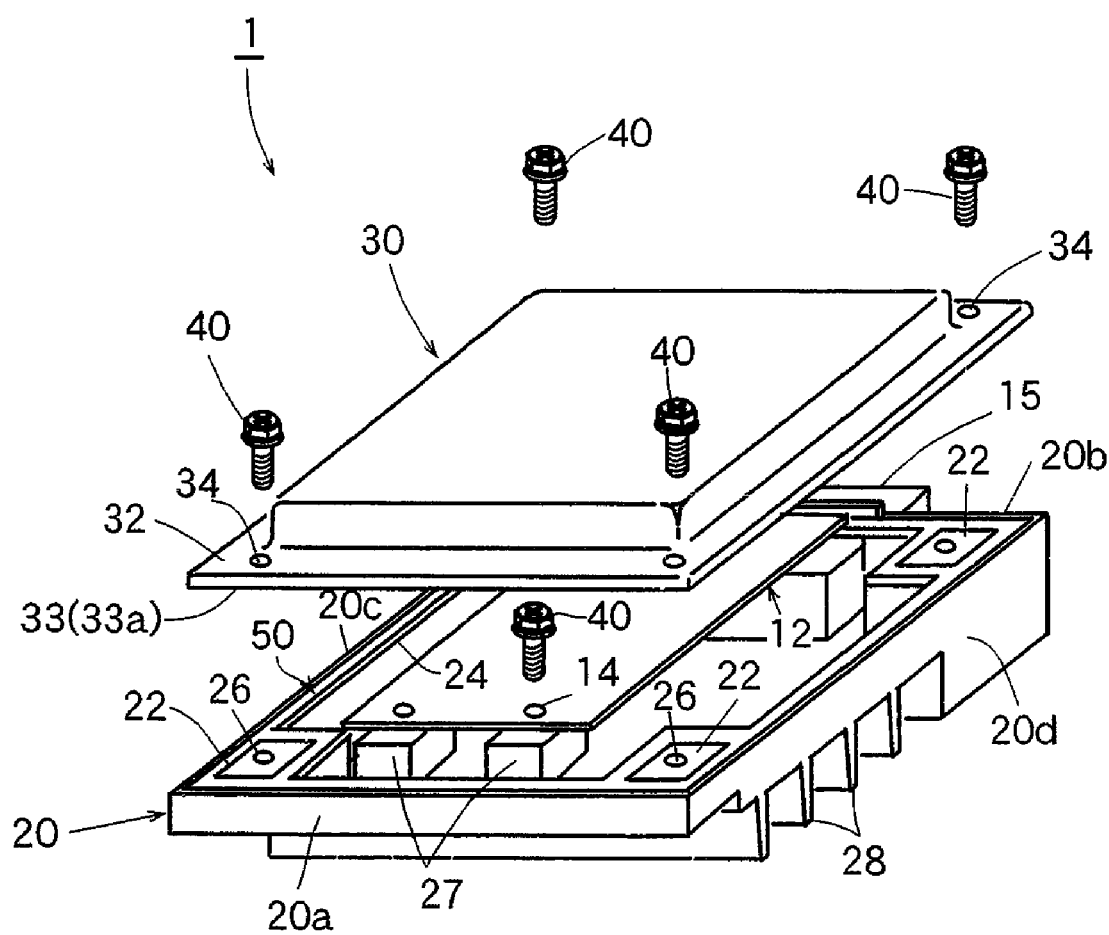
FIG. 1 is an exploded perspective view schematically illustrating one embodiment of the engine controller according to the present invention.
Figure 2:
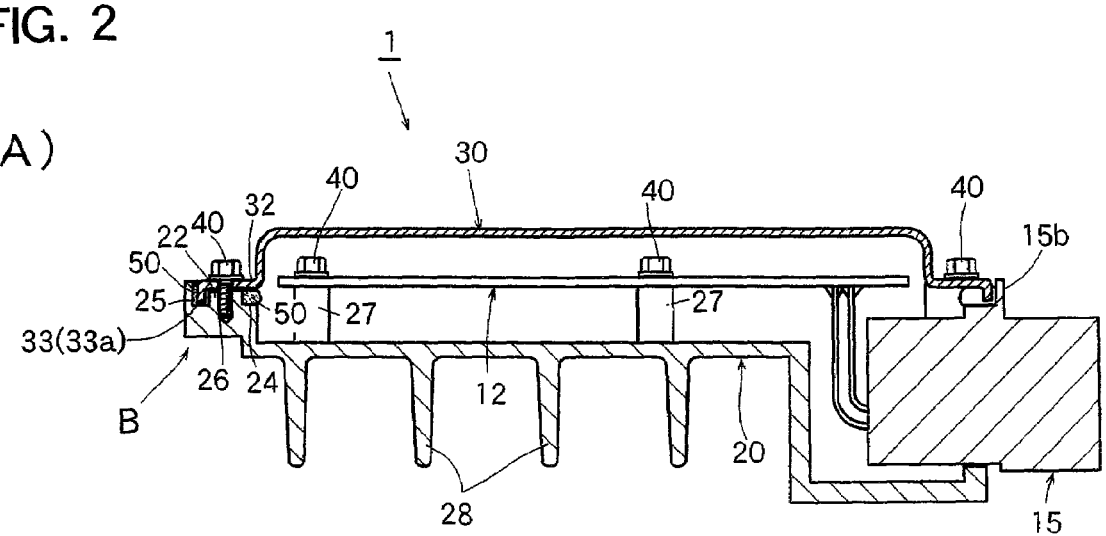
FIG. 2 shows the engine controller shown in FIG. 1, wherein (A) is a cross-sectional view thereof and (B) is an enlarged view of the region B of (A)
Figure 2:
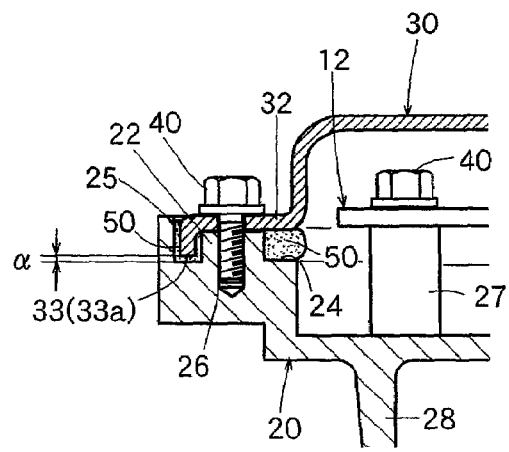

FIGS. 1 and 2 are an exploded perspective view and a cross-sectional view, respectively, for schematically illustrating one embodiment of the engine controller according to the present invention.

The engine controller 1 shown in FIGS. 1 and 2 is of electronic controlling type utilizing a microcomputer and comprises a circuit board 12 for controlling the engine, a connector 15 for receiving or transmitting signals between the circuit board 12 and external instruments (various kinds of sensors and actuators), a main case body 20 having an open top for housing the circuit board 12, etc., and a covering member 30 which is designed to be fixedly clamped to the main case body 20 by means of a setscrew (a washer-attached hexagon head bolt) 40 so as to hermetically close the open top of the main case body 20.

Figure 7:
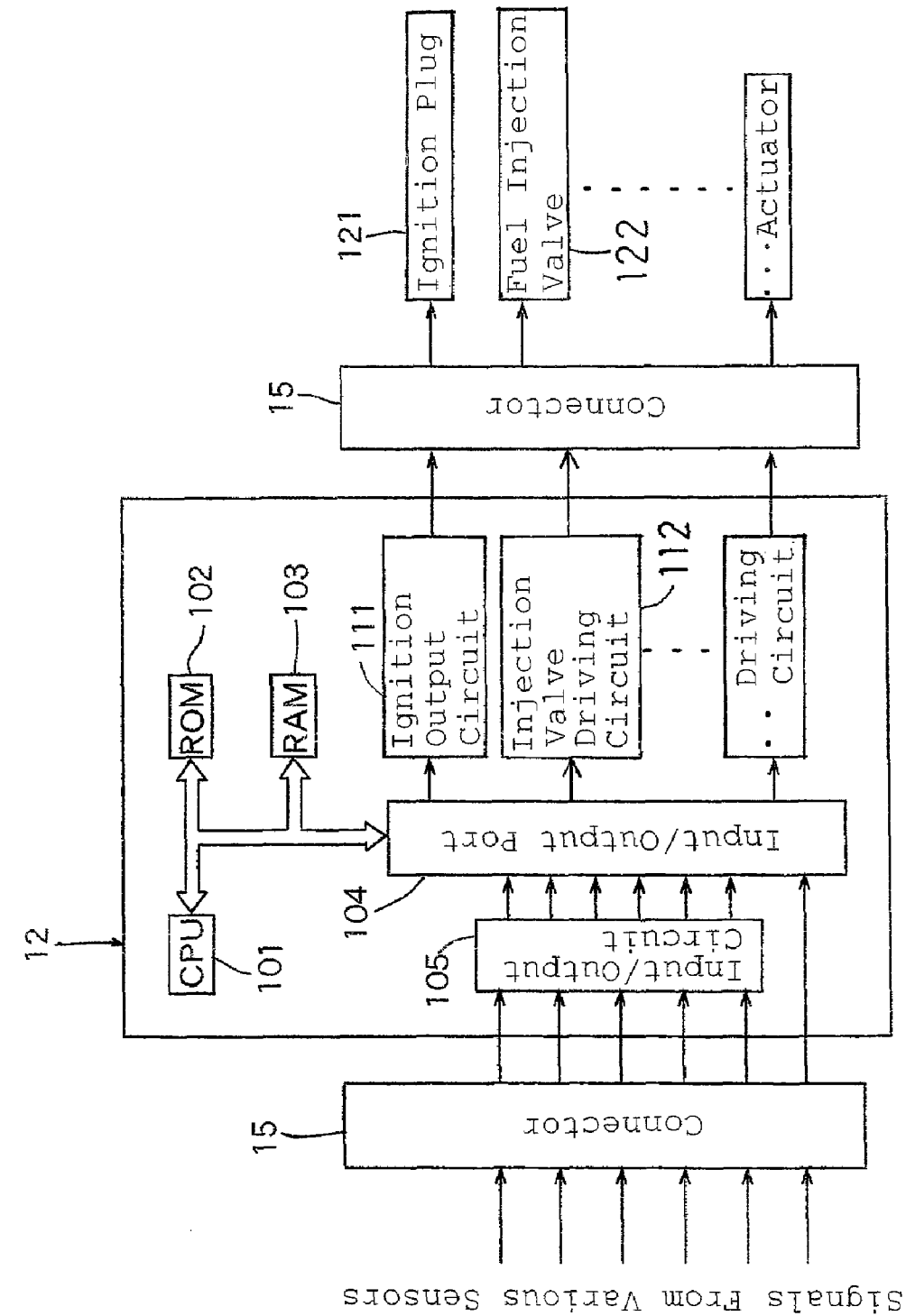
FIG. 7 shows a block diagram schematically illustrating the construction of the circuit board shown in FIGS. 1 and 2.

The circuit board 12 is provided thereon with electronic components (computer components) for controlling an engine and, at the same time, with a predetermined wiring pattern. More specifically, as schematically shown in the block diagram of FIG. 7, on this circuit board 12 are formed not only CPU 101, ROM 102 and RAM 103 which are connected with each other by means of bus, but also an input/output port 104, an input circuit 105 into which detected signals from various kinds of sensors such as a crank angle sensor and a water temperature sensor are transmitted through the connector 15, and various kinds of actuator driving circuits such as an ignition output circuit 111 and an injection valve-driving circuit 112. By way of the various kinds of actuator driving circuits such as an ignition output circuit 111 and an injection valve-driving circuit 112, drive-controlling signals are designed to be transmitted through the connector 15 to various kinds of actuators such as an ignition plug 121, a fuel injection valve 122, etc. at a predetermined timing.

The main case body 12 is formed, by means of aluminum die-casting, into a box-like configuration having front, rear, right and left sidewalls 20a, 20b, 20c and 20d, and a stepped bottom wall 20e (made shallower at the front portion thereof). On the top surface of the bottom wall 20e, there are erected a plurality of columns 27 on which the circuit board 12 is designed to be mounted. This circuit board 12 is fixedly clamped to these columns 27 by means of setscrews 40. On the underside of the bottom wall 20e, there are projected a plurality of cooling fins 28.

At each of four corners of the main case body 20, a clamping pedestal (fixing portion) 22 is provided so as to permit four corners of the collar portions 32 of covering member 30 to be press-contacted with and fixedly clamped to the clamping pedestal 22 by means of setscrews 40. The connector 15 is secured to the rear sidewall 20d of the main case body 20.

Along all of the inner sides of the sidewalls 20a, 20b, 20c and 20d (including the inner side of the clamping pedestal 22 and of an erected wall 15b projected from the upper surface of connector 15) defining the open top of main case body 20, there is provided a filling pedestal 24 which is lowered in level from the clamping pedestal 22 and on which a water-proofing adhesive 50 is to be piled. Further, along the entire outer peripheral side of the clamping pedestal 22 (the sidewall thereof located close to the sidewalls 20a, 20b, 20c and 20d) also, there is provided a groove 25 on which a water-proofing adhesive 50 is to be piled, the bottom of the groove 25 being the same in level with the filling pedestal 24.

As for the water-proofing adhesive 50, a jelly-like adhesive which is higher in viscosity than water and capable of exhibiting some degree of shape-retaining property so that it does not flow out as it is piled can be employed. By the way, this jellied water-proofing adhesive 50 is available in the market and is featured in that it takes 3 to 4 days before the curing thereof at room temperature but can be cured within about one hour if the temperature thereof is increased up to about 100° C.

On the other hand, the covering member 30 is formed of an inverted dish-like or a hat-like configuration having a collar portion 32 (the outer peripheral edge portion 33 thereof is bent downward), which can be manufactured through punching press molding of a raw material constituted by an iron-based metal plate whose surface is preliminarily applied with plating. The lower peripheral edge face 33a of the outer peripheral edge portion 33 of collar portion 32 is constituted by an outer peripheral edge face (cut surface) of the covering member 30 to which plating is not applied and hence this outer peripheral edge face 33a is accompanied with a problem that rust tends to generate as it is exposed to air.

Therefore, in this embodiment, the water-proof structure and rust-proof structure of engine controller are secured by adopting the following mounting structure of the covering member 30 to the main case body 20 in combination with the water-proofing adhesive 50.

Specifically, prior to the mounting of the covering member 30 on the main case body 20, the jellied water-proofing adhesive 50 is piled, at predetermined width and thickness, on the filling pedestal 24 as well as on the filling groove 25 so as to prevent the water-proofing adhesive 50 from overflowing therefrom. In this case, the water-proofing adhesive 50 is piled on the filling pedestal 24 so as to make the adhesive protrude upward from the top surface of clamping pedestal 22 (i.e. semi-circular in cross-section), thereby enabling the underside of the collar portion 32 of covering member 30 to hermetically contact with the water-proofing adhesive 50 without leaving any gap therebetween. Further, the water-proofing adhesive 50 is piled on the filling groove 25 to such an amount as to make the upper surface of the piled waterproofing adhesive 50 become lower than the top surface of the clamping pedestal 22 (so as to prevent the water-proofing adhesive 50 from overflowing as the outer peripheral edge face 33a of outer the collar portion 32 is buried in the waterproofing adhesive 50).

Thereafter, the covering member 30 (four corners of the collar portion 32 thereof) is placed on the clamping pedestal 22 and, at the same time, the outer peripheral edge face 33a of the collar portion 32 is pressed into and buried in the waterproofing adhesive 50 which has been piled on the filling pedestal 24 and on the filling groove 25. In this case, the dimension of the outer peripheral edge portion 33 of collar portion 32 as well as the dimension of the filling groove 25 is adjusted so as to leave a predetermined gap "a" between the lower peripheral edge face 33a and the filling pedestal 24 (the top surface thereof and the underside of the filling groove 25).

Thereafter, the setscrews 40 are screwed, through insertion holes 34 formed in the collar portion 32 of covering member 30, into the female screws 26 formed in the clamping pedestal 22, thereby fixedly clamping the covering member 30 to the main case body 20.

When the water-proofing adhesive 50 is cured under this condition, the interior between the main case body 20 and the covering member 30 is hermetically sealed by the waterproofing adhesive 50 and, at the same time, the lower peripheral edge face 33a of the covering member 30 which has been buried in the water-proofing adhesive 50 is substantially completely covered by the water-proofing adhesive 50. Additionally, the underside of the collar portion 32 is closely contacted with the water-proofing adhesive 50 that has been piled on the filling pedestal 24 which is provided on the inner side of the clamping pedestal 22.

As described above, in the case of the engine controller 1 of this embodiment, since the entire outer peripheral edge face (cut surface) 33a of the covering member 30 is buried in and substantially covered by the water-proofing adhesive 50 piled on the pedestal 24 and the groove 25 formed on the main case body 20, the outer peripheral edge face 33a is prevented from being contacted with air. As a result, it is possible to reliably prevent the generation of rust on the outer peripheral edge face 33a of the covering member 30. Therefore, even if an inexpensive iron-based metal plate, such as a plated steel plate is employed for forming the covering member, it is possible to secure excellent rust-proofness in addition to excellent water-proofness and rust-proofness even under a severe environment, thereby making it possible to effectively reduce the manufacturing cost and to enhance the reliability of engine controller.

Further, since a water-proofing adhesive is provided between the main case body 20 and the covering member 30 circumferentially internally of a fixedly clamped portion 22 of the main case body 20 where the covering member 30 is clamped to the main case body 20, so as to hermetically seal the interior of the main case body 20, and wherein a liquid or jellied water-proofing adhesive 50 is provided also between the main case body 20 and the covering member 30 circumferentially externally of the fixedly clamped portion 22 where the covering member is clamped to the main case body 20, so as to hermetically seal the fixedly clamped portion 22, it is possible to reliably prevent the generation of rust and loosening at a portion where the setscrew 40 is located, thus further enhancing the reliability of engine controller.

Figure 3:
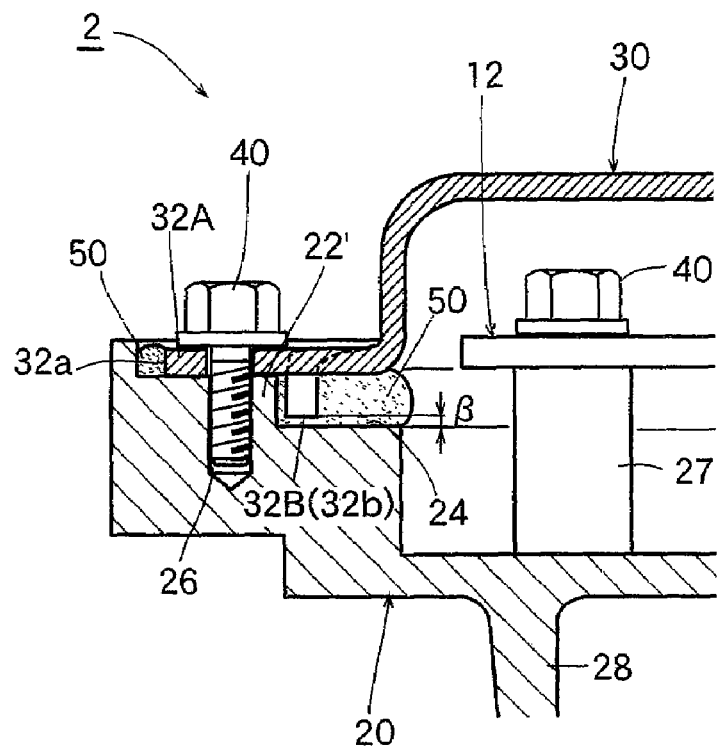
FIG. 3 is a partially enlarged cross-sectional view of the engine controller representing another embodiment of the present invention.

FIG. 3 illustrates another embodiment of the engine controller according to the present invention. The engine controller 2 of this embodiment presents measures to cope with a situation where the outer peripheral edge portion 33 of the collar portion 32 of covering member 30 cannot be bent downward in contrast to the aforementioned embodiment due to large thickness of the covering member 30, etc. In the engine controller 2 shown in FIG. 3, only the four corner portions 32A of the collar portion 32 of covering member 30 are placed on the clamping pedestal 22' where the filling groove 25 is not formed and the peripheral portions, each located between the corner portions 32A, are bent downward (downwardly bent portions 32B) and the peripheral edge face 32a of each of the four corner portions 32A is disposed vertically on the clamping pedestal 22' and covered by the water-proofing adhesive 50. The outer peripheral edge face 32b of the downwardly bent portions 32B is horizontally disposed with a gap "β" being secured between the outer peripheral edge face 32b and the top surface of the filling pedestal 24, thus enabling the outer peripheral edge face 32b to be completely buried in the water-proofing adhesive 50 piled on the filling pedestal 24.

Even in the case of the engine controller 2 constructed in this manner, it is possible to obtain the same effects as those of the aforementioned embodiment.

Figure 4:
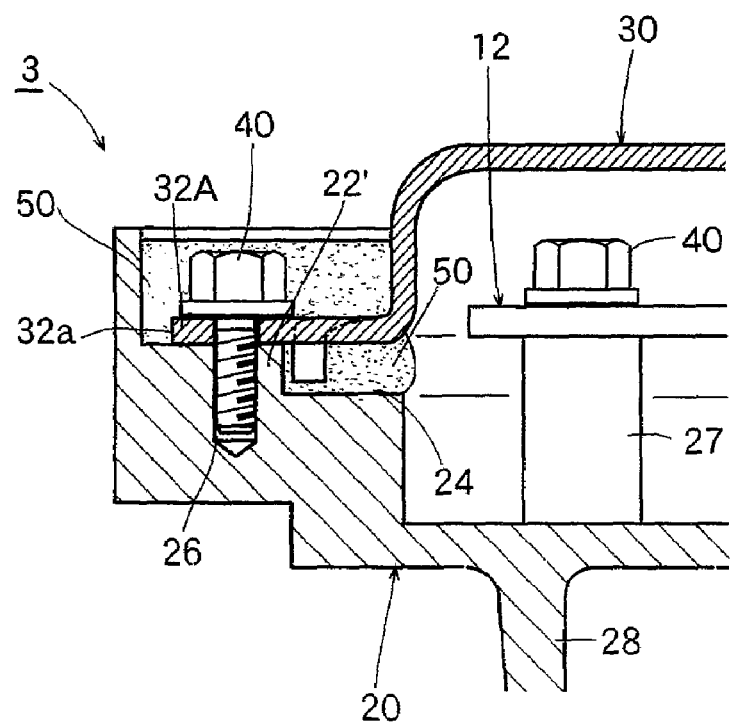
FIG. 4 is a partially enlarged cross-sectional view of the engine controller representing a further embodiment of the present invention.

FIG. 4 illustrates a further embodiment of the engine controller according to the present invention. In the engine controller 3 of this embodiment, the structures of the main case body 20 and the covering member 30 are the same as those shown in FIG. 3. In this case however, subsequent to the fixing of the covering member 30 to the main case body 20 by means of setscrews 40, the water-proofing adhesive 50 is piled on the pedestal 22' on which the four corner portions 32A are mounted to such an extent that not only the peripheral edge face 32a can be buried therein but also the head portion of the setscrew 40 can be buried therein (by the way, a water-proofing adhesive having a viscosity which is lower than that of jelly may be employed in this case). In this manner, the piling or filling of the water-proofing adhesive 50 can be performed subsequent to the fixing of the covering member 30. Even in this embodiment, it is possible to obtain the same effects as those of the aforementioned embodiment.

Figure 5:
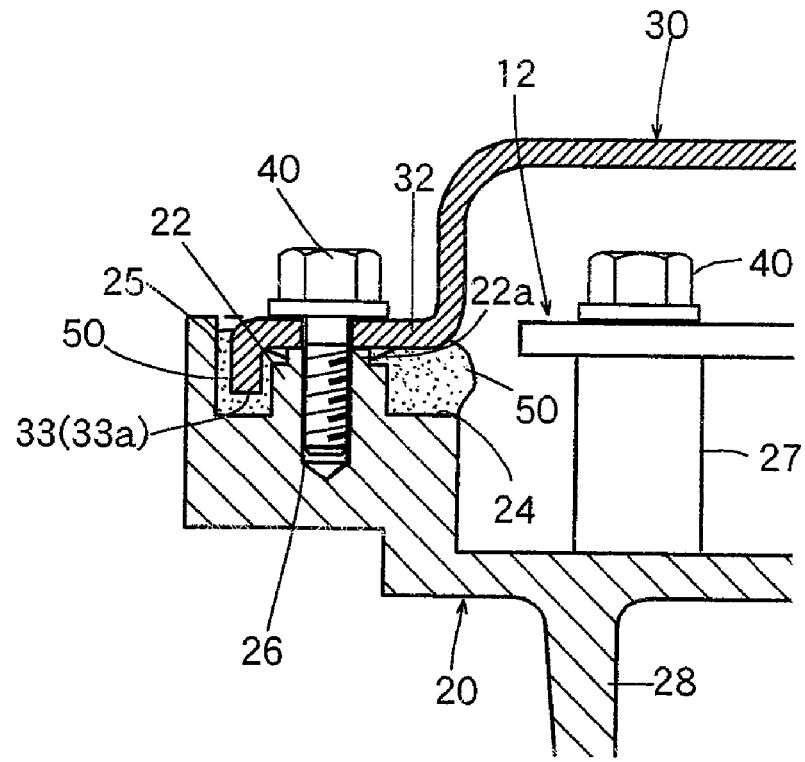
FIG. 5 is a partially enlarged cross-sectional view of a modified embodiment of the engine controller shown in FIGS. 1 and 2.
Figure 6:
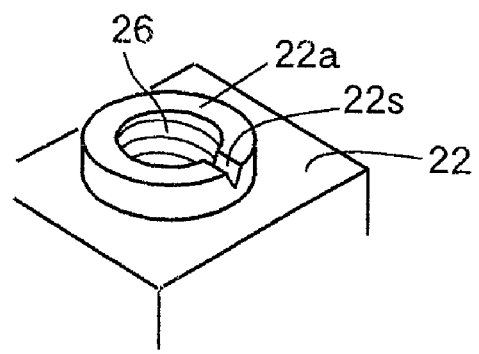
FIG. 6 is a partially enlarged perspective view of the detailed configuration of the convex portion provided on the clamping pedestal shown in FIG. 5.

FIG. 5 illustrates a further embodiment of the engine controller which is constructed in the same manner as the engine controller 1 shown in FIGS. 1 and 2 but is featured in that a convex portion 22a having a rectangular external configuration in cross-section is projected from the top surface of the clamping pedestal 22 so as to prevent the water-proofing adhesive 50 from flowing into the region of female screw 26 which is provided at a central portion of the clamping pedestal 22 on the occasion when the covering member 30 is mounted. By the way, since the female screw 26 to be engaged with the setscrews 40 is formed at a central portion of the clamping pedestal 22 including the convex portion 22a, the configuration of the convex portion 22a would become a short cylindrical configuration (or a short prismatic configuration) as shown in FIG. 6.

Further, for the convenience of fixing the covering member 30 by means of the setscrews 40, at least one notched groove 22s having a V-shaped cross-sectional configuration (it may be U-shaped, semicircular or rectangular configuration) for air vent is formed in an upper surface portion of the convex portion 22a.

As described above, since the convex portion 22a having the notched groove 22s for air vent is provided in this manner, it is possible to effectively prevent the water-proofing adhesive 50 from flowing into the region of female screw 26. As a result, the fixing of the covering member 30 to the main case body by means of the setscrews 40 can be facilitated and, at the same time, it is possible to prevent the loosening of the setscrews 40.

The invention claimed is:

1. An engine controller comprising:

a circuit board for controlling an engine;

an aluminum die-cast main case body having an open top for housing the circuit board; and a covering member made of an iron-based metal plate which is preliminarily applied with a surface treatment, the covering member being fixedly clamped to the main case body by a setscrew so as to hermetically close the open top of the main case body;

wherein the main case body is provided, at the open top thereof, with a pedestal or groove on which a liquid or jellied water-proofing adhesive is coated or filled, thereby enabling at least a cut surface of an entire outer peripheral edge face of the covering member to be substantially covered by the water-proofing adhesive coated or filled on the pedestal or groove, thus hermetically sealing the interior of the main case body;

wherein the liquid or jellied water-proofing adhesive is provided between the pedestal or groove of the main case body and the covering member circumferentially internally of a fixedly clamped portion of the main case body where the covering member is clamped to the main case body by the setscrew, so as to hermetically seal the interior of the main case body, wherein the liquid or jellied water-proofing adhesive is provided also between the pedestal or groove of the main case body and the covering member circumferentially externally of the fixedly clamped portion of the main case body where the covering member is clamped to the main case body by the setscrew, so as to hermetically seal the fixedly clamped portion of the main case body, and wherein the fixedly clamped portion is provided with a female screw portion into which the setscrew is screwed, and the fixedly clamped portion is provided, at a top surface thereof, with a convex portion in order to prevent the water-proofing adhesive from overflowing into the female screw portion.

2. The engine controller according to claim 1, wherein the covering member is manufactured through punching press molding of a raw material constituted by an iron-based metal plate whose surface is preliminarily applied with plating as the surface treatment.

3. The engine controller according to claim 1, wherein the covering member is formed into an inverted dish-like or a hat-like configuration having a collar portion and an entire outer peripheral edge face of the collar portion is substantially covered by the water-proofing adhesive which is coated or filled on the pedestal or groove.

4. The engine controller according to claim 3, wherein the outer peripheral edge face of the collar portion of the covering member is bent downward.

5. The engine controller according to claim 1, wherein the main case body and the covering member are respectively formed into a rectangular configuration in plan view and four corners of the main case body are allocated as the fixedly clamped portion.

6. The engine controller according to claim 1, wherein the convex portion is provided with at least one notched groove for venting air.

\* \* \* \* \*